United States Patent [19]

Tiedje

[11] Patent Number: 4,578,641

[45] Date of Patent: Mar. 25, 1986

[54] SYSTEM FOR MEASURING CARRIER LIFETIME OF SEMICONDUCTOR WAFERS

[75] Inventor: J. Thomas Tiedje, Garwood, N.J.

[73] Assignee: Exxon Research and Engineering Co., Florham Park, N.J.

[21] Appl. No.: 422,669

[22] Filed: Sep. 24, 1982

[51] Int. Cl.[4] .............................................. G01R 1/04
[52] U.S. Cl. .............................. 324/158 D; 324/65 P; 324/158 F
[58] Field of Search ............ 324/DIG. 1; 324/158 R, 324/158 D, 158 T, 77 B, 77 C; 331/66

[56] References Cited

U.S. PATENT DOCUMENTS

| | | | |
|---|---|---|---|
| 2,215,213 | 9/1940 | Ellis | 324/65 P |
| 3,206,674 | 9/1965 | Thuy et al. | 324/DIG. 1 |
| 3,437,929 | 4/1969 | Glenn | 324/158 F |
| 4,286,215 | 8/1981 | Miller | 324/158 D |

OTHER PUBLICATIONS

Maguire, "New Technique for Producing Ultrapure Semiconductors", Electronics, vol. 34, No. 27, Jul. 7, 1961, pp. 41–45.

Weingorten, "Radio Frequency Carrier and Capacitive Coupling Procedures for Resistivity and Lifetime Measurements on Silicone" Journal of the Electrochemical Soc., vol. 108, No. 2, pp. 167–171.

*Primary Examiner*—Michael J. Tokar
*Attorney, Agent, or Firm*—Ronald D. Hantman

[57] ABSTRACT

A contactless rf technique for measurement of the carrier lifetime from the photoconductivity induced in silicon wafers by a flash of infrared light. The carrier lifetime is inferred from the photoconductivity decay.

11 Claims, 3 Drawing Figures

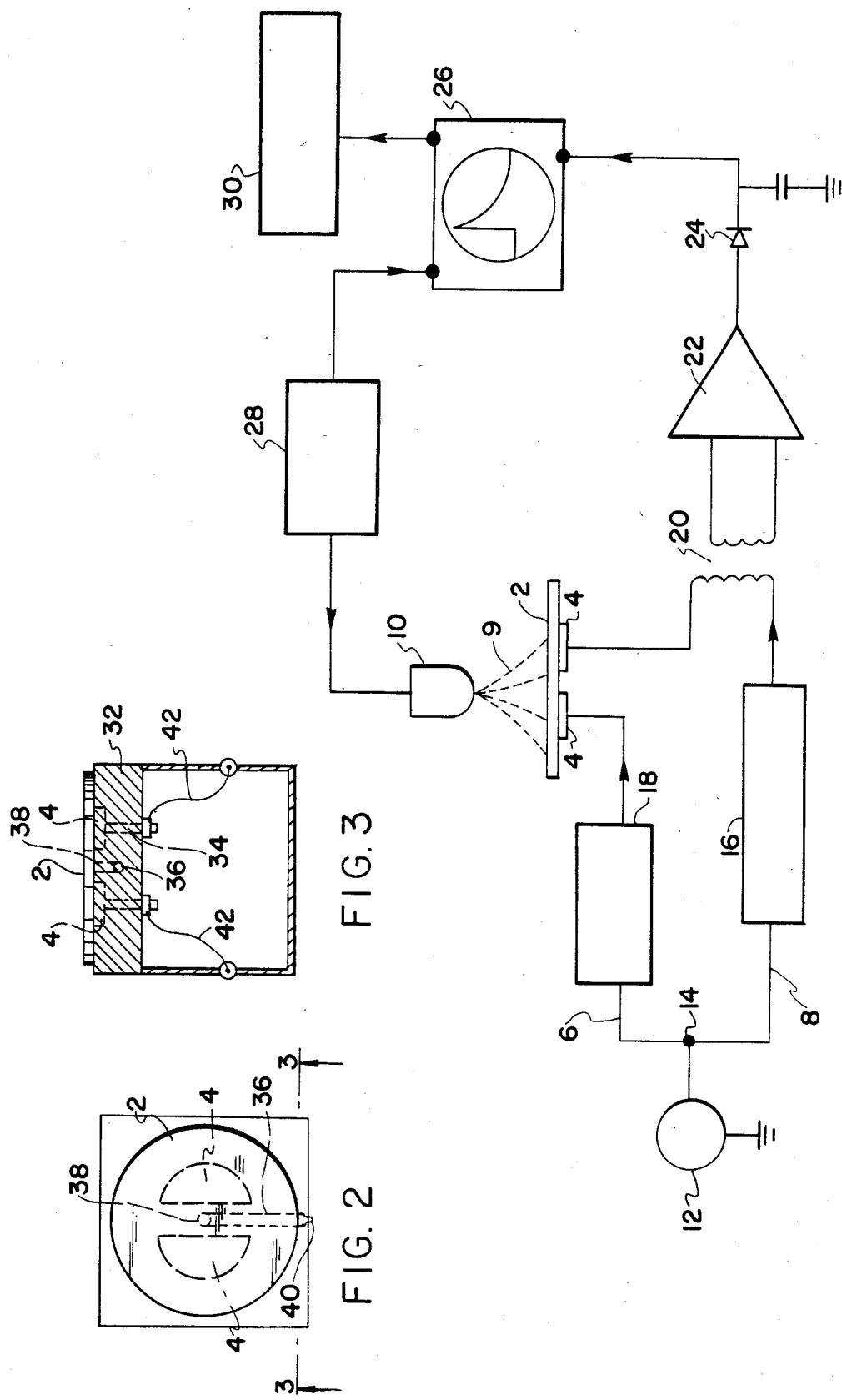

SYSTEM FOR MEASURING CARRIER LIFETIME OF SEMICONDUCTOR WAFERS

BACKGROUND OF THE INVENTION

The present invention relates to a system for measuring the carrier lifetime in semi-conductor wafers.

The minority carrier lifetime is one of the most important measures of the electronic quality of crystalline silicon for solar cells. One application of lifetime measurements is in solar cell manufacturing, where there is a need to monitor the quality of the starting wafers prior to solar cell fabrication. In this application a fast and reliable technique for measuring the lifetime in unprocessed wafers is required. Also from a materials research viewpoint, lifetime measurements are a straight forward way to evaluate the effectiveness of novel material refining processes.

There is a substantial amount of prior art on lifetime measurements in crystalline silicon, with discussions of numerous techniques, see e.g., "Lifetime Factors in Silicon" ASTM STP 712, American Society for Testing and Materials (1980). This prior art can be summarized by saying that the best methods generally require finished devices and that for crystalline silicon solar cells the preferred technique is probably the spectral response of the collection efficiency, see e.g., A. G. Milnes and D. L. Feucht, "Heterojunctions and Metal Semiconductor Junctions", Academic Press (1972). This technique measures a quantity related to the lifetime, namely the minority carrier diffusion length. Although the diffusion length may be more directly relevant to solar cell performance, the lifetime itself which can be more directly related to the properties of the material can also be determined in the device from the open circuit voltage decay or short circuit current decay. In many situations, such as screening wafers prior to processing, or monitoring the effect of processing steps on the lifetime, measurements on devices are not feasible. In principle, the spectral response technique can be applied to unprocessed wafers (where it is called "surface photovoltage"), however, in practice this technique is difficult and unsuited to repetitive measurements on many wafers.

In the present invention, a new contactless system for making lifetime measurements has been developed that is a convenient and reliable way to determine the lifetime in unprocessed silicon wafers.

BRIEF DESCRIPTION OF THE DRAWINGS

FIG. 1 shows a schematic diagram of the measurement system of the present invention.

FIG. 2 shows the top view of the electrode-wafer interconnection.

FIG. 3 shows a cross-section of the electrode-wafer interconnection.

SUMMARY OF THE INVENTION

A system for measuring the carrier lifetime in semiconductor wafers which includes a bridge circuit including a quick disconnect mechanical contact system for electrically coupling the silicon wafer to the bridge circuit, an A-C signal generator coupled to the bridge, a means for illuminating the silicon wafers, and a means for monitoring the output from the bridge circuit.

DESCRIPTION OF THE PREFERRED EMBODIMENT

For purposes of description the present invention shall be illustrated and described with the measurement of the carrier lifetime in silicon wafers although other semiconductor wafers may be used.

The system utilizes capacitive coupling between the sample and a non-resonant rf bridge that is used to measure the photoconductivity induced in the wafer by a flash of infrared radiation with wavelengths in the range (for silicon) $0.7 \ \mu m < \lambda < 1.1 \ \mu m$. The silicon wafer is placed on two flat coplaner metal electrodes, and held in position by its own weight or with a vacuum hold-down.

In a practical situation, the electrodes are not perfectly parallel or flat and, therefore, the wafer will touch the electrodes at only a few isolated points. Even at these contact points, there is substantially no electrical connection between the semiconductor wafer and the electrodes because of the insulating oxide on the wafer (a native oxide grows on silicon in air). Thus, the connection between the wafer and the electrodes is a capacitive connection.

Since the circuit is not purposely designed to be resonant no turning is required when samples are changed. This feature is a major advantage over resonant systems for the purposes of quality checking large numbers of wafers. The photoconductivity induced in the wafer by the flash of radiation changes the electrical impedance of the wafer and alters the output of the bridge circuit. The carrier lifetime is inferred from the decay time of the photoconductivity. The radiation may be produced by a variety of sources, e.g., light emitting diode or flaphlamp. However, an infrared laser with output in the range 0.7 to 1.1 microns is the preferred source for silicon. The requirement of the source is that it be capable of having its output terminated in less time than the lifetime of the carriers in the semiconductor. In most practical situations for silicon wafers which are used in solar cells the quality of the semiconductor is such that the radiation output should be terminated in less than $1.0 \ \mu sec.$, preferably less than $0.5 \ \mu sec.$ For silicon wafers whose lifetime is less than $1.0 \ \mu sec.$, the solar cell efficiency is normally too low for commercially desirable cells.

Referring to FIG. 1 shows a schematic diagram of the system of the present invention. The wafer 2 is placed on top of the two flat electrodes. The circuit is a bridge with two arms 6 and 8. One arm 6 contains the sample 2 the other containing an adjustable attenuator. Both arms together include whatever additional elements are needed so that the two arms may be balanced. When the two arms of the bridge are balanced, the output is zero. The flash of light on the sample will momentarily unbalance the bridge and generate an output. With this arrangement and signal averaging 300 hz repetition rate light flashes for about 1 sec., resistance changes of less than one part in $10^4$ are detectable.

Referring to FIGS. 2 and 3 shows a preferred arrangement for the electrodes 4. In this arrangement, the electrodes 4 are half-moon shaped with a cross-sectional area of about 1 $cm^2$ separated by a gap of about one-half cm. between their flat edges.

The electrodes 4 are inlaid into the top surface of a teflon block 32 and held in place by screws 34 through the block 32. The top surface of the teflon block 32 and the electrodes 4 are milled flat with the electrodes in place. Wires 42 electrically connect the electrodes 4 to the bridge circuit. An L-shaped passageway 36 is formed through the teflon block 32 passing horizontally through the block 32 beginning with hole 38 at the center of the top of the block 32 and terminating at the side of the side of the block 32. A nipple 40 is threaded into the block 32 for making a connection to a vacuum hose (not shown). When a source of negative pressure (half an atmosphere is adequate) is connected to the nipple 40 the suction pulls the wafer 2 against the teflon block 32 and holds it in place against the electrodes 4. The capacitance between the electrodes 4 and the wafer 2 is now insensitive to changes in the orientation of the sample holder or other external disturbances.

The system measures the decay time of the photoconductivity produced by a 90 ns burst of near-infrared (0.9 $\mu$m) light from a GaAs laser-diode array 10. The photoconductivity decay is time-resolved with a rf bridge circuit that is capacitively connected to the silicon wafer 2 by two flat electrodes pressed against one side of the wafer by the weight of the wafer or, alternately, by a vacuum holddown as described above. The rf signal from an oscillator 12 such as a HP 3200B oscillator manufactured by Hewlett Packard, whose maximum output is 23 bdm, is divided by a BNC "T" 14 into two branches, one branch containing a variable attenuator 16 (0–30 db) and the other branch containing the sample 2 and a phase shifter 18 (such as PS-5-113B manufactured by Merrimac). The output of the two branches is combined in a transformer 20 such as model PD20-50 manufactured by Merrimac and then amplified by two wideband amplifiers 22 such as the Avantek AMM-1010 and Mini-Circuits ZHL-1A, whose total gain is 39 db and maximum output 30 dbm. Finally, the signal is rectified in a Schottky barrier diode detector 24 such as HP 5082-2800 and monitored on a 10 Mhz bandwith oscilloscope 26.

A power supply 28 provides power to the laser 10 and triggers the oscilloscope 26. In addition, a signal averager 30 may be used to improve the signal to noise ratio and facilitate reading the output of oscilloscope 26.

A suitable rf frequency is 100 Mhz, although other frequencies can also be used. The lower limit to the rf frequency is set by the minority carrier lifetime. For an accurate measure of the lifetime, there must be a number of rf cycles during the time interval in which the photoconductivity decays. For example, if $\tau$ is the minority carrier lifetime then measurement frequencies f greater than about $10/\tau$ are acceptable. High frequencies have the virtue of reducing the capacitive impedance between the coupling electrodes and the wafer, so that the signal is larger. However, the simple lumped circuit measurement apparatus is not suitable for measurements at frequencies above about 500 Mhz. At these frequencies the dimensions of the circuit become comparable to a wavelength of the rf field and direct coupling between the flat electrodes, bypassing the sample, will limit the sensitivity of the apparatus. Also rf circuit components designed to work at high frequencies are generally more expensive than those designed to work at lower frequencies.

Since the system uses the technique of measuring the change in the resistance of the wafer 2, induced by a light flash, the relative magnitude of the coupling capacitance to the flat electrodes is not crucial. The present apparatus works well even when the wafer resistance is small compared to the impedance of the coupling capacitance.

The measurement is started by adjusting the phase shifter and attenuator so that the rf amplifier output is nulled, normally about 40 db below the unbalanced output. Then the sample is illuminated by the laser diode array such as manufactured by Laser Diode Laboratories, which is run at 300 hz and a peak output power of about 400 W/cm$^2$. The output signal monitored on the oscilloscope can be maximized by further fine adjustments of the phase shifter and attenuator. Since the bridge is an AC circuit, it will be most sensitive to conductivity variations, when the unbalance signal is in-phase with the optically induced signal from the laser diodes.

The two main requirements of the bridge circuit are first, that it be sensitive enough to detect the conductivity change in the wafer, produced by the incident radiation, and second, that it be fast enough to follow the photoconductivity decay.

The response time of the measurement apparatus is determined by the rf frequency and the RC smoothing time constant of the diode detector. Since the bridge circuit is not a resonant circuit, the energy storage time in the rf circuit is not a significant factor in the response time.

In order to get an accurate estimate of the photoconductivity decay time it would be desirable to be able to follow the exponential part of the decay over one or two orders of magnitude. If we allow an additional order of magnitude decay in the signal at the beginning to give the initial non-exponential transient a chance to disappear and assume better than one part in $10^4$ resolution for the circuit, then the light flash should increase the dark carrier concentration by about 1%. The power requirements of the source vary depending on the sensitivity of the bridge circuit and the dark conductivity of the wafer. Typical solar cell wafers have resistivities in the 0.3—3.0$\Omega$ cm range. The corresponding carrier concentration is $2\times10^{15} - 3\times10^{16}$ cm$^{-3}$. For a typical 300 $\mu$m thick wafer an infrared source capable of producing in excess of about $10^{13}$–$10^{14}$ photons in a short ($<1$ $\mu$s) flash, is required. This is equivalent to in excess of 2–20 micro joules for one micron wavelength radiation. The GaAs laser diodes discussed above are suitable.

Finally, the skin depth must be large enough to allow the electromagnetic field to penetrate into the wafer. At 12 Mhz in a material with a resistivity of 1$\Omega$ cm, the skin depth is about 1.5 cm so that the field penetrates uniformly through typical wafers.

What is claimed is:

1. A system for measuring the carrier lifetime in semiconductor wafers comprising:
    (a) a bridge circuit including a quick disconnect mechanical contact system for capacitively coupling said silicon wafer to said bridge circuit, wherein said wafer is held in position with a vacuum holddown, wherein said bridge consists of two branches, one branch consisting of said capacitively coupled wafer in series with a phase shifter, the other branch consisting of a variable attenuator, the output of said two branches being combined in a transformer,
    (b) an A-C signal generator coupled to said bridge through a T connection,
    (c) a means for illuminating said wafers with radiation,
    (d) a means for monitoring the output from said bridge circuit.

2. The system of claim 1 wherein said mechanical contact system includes two flat coplaner metal electrodes.

3. The system of claim 1 wherein said bridge circuit indicates two branches, with input from said A-C signal generator with frequency within the range of 5 Mhz and 500 Mhz and whose output of said branches is fed via a transformer to an amplifier.

4. The system of claim 1 wherein said means for illuminating the wafers with radiation is a laser which operates within the range of 0.7 and 1.1 microns.

5. The system of claim 4 wherein said monitoring means includes a diode detector and an oscilloscope.

6. The system of claim 1 in which said bridge circuit is a radio frequency bridge circuit with frequency between 5 Mhz and 500 Mhz with two arms and wherein one arm includes said semiconductor wafer and coupling electrodes.

7. The measurement system in claim 4 wherein said lamp is a solid state diode laser or diode laser array with an emission wavelength in the 0.7–1.1 $\mu$m range.

8. A system for measuring the carrier lifetime in semiconductor wafers comprising:
(a) a bridge circuit including a quick disconnect mechanical contact system for capacitively coupling said silicon wafer to said bridge circuit, wherein said mechanical contact system includes two flat coplaner metal electrodes shaped like half-moons separated by a gap of about one-half cm. between their flat edges, wherein said bridge consists of two branches, one branch consisting of said capacitively coupled wafer in series with a phase shifter, the other branch consisting of a variable attenuator, the output of said two branches being combined in a transformer,
(b) an A-C signal generator coupled to said bridge through a T connection,
(c) a means for illuminating said wafers with radiation,
(d) means for monitoring the output from said bridge circuit.

9. The system of claim 8 wherein said electrodes are inlaid into the surface of a block made of non-conducting material.

10. The system of claim 9 further comprising a passageway through a teflon block, between said electrodes, one end of said passageway terminating against said wafer, the other end of said passageway connected to source of negative pressure such that holding said wafer against said electrodes.

11. The system of claim 9 wherein said block is made of teflon.

* * * * *